(12) United States Patent
Miyata

(10) Patent No.: US 11,624,973 B2
(45) Date of Patent: Apr. 11, 2023

(54) LIGHT EMITTING DEVICE HAVING COLUMNAR PARTS SURROUNDED BY CONCAVO-CONVEX SHAPES AND PROJECTOR

(71) Applicant: Seiko Epson Corporation, Tokyo (JP)

(72) Inventor: Takashi Miyata, Shiojiri (JP)

(73) Assignee: SEIKO EPSON CORPORATION

( * ) Notice: Subject to any disclaimer, the term of this patent is extended or adjusted under 35 U.S.C. 154(b) by 249 days.

(21) Appl. No.: 17/034,171

(22) Filed: Sep. 28, 2020

(65) Prior Publication Data

US 2021/0096452 A1    Apr. 1, 2021

(30) Foreign Application Priority Data

Sep. 30, 2019   (JP) .............................. JP2019-178867

(51) Int. Cl.
*G03B 21/20* (2006.01)
*H01L 33/62* (2010.01)
(Continued)

(52) U.S. Cl.
CPC .......... *G03B 21/2033* (2013.01); *H01L 33/38* (2013.01); *H01L 33/54* (2013.01); *H01L 33/62* (2013.01)

(58) Field of Classification Search
CPC ..... G03B 21/2033; H01L 33/38; H01L 33/54; H01L 33/62
See application file for complete search history.

(56) References Cited

U.S. PATENT DOCUMENTS 10,816,884 B2 * 10/2020 Ishizawa ............ G03B 21/2013
2004/0157354 A1 * 8/2004 Kuriyama ............ H01L 31/105
                                                        438/45
(Continued)

FOREIGN PATENT DOCUMENTS

JP       2005-005266 A       1/2005
JP       2009140976 A   *   6/2009
(Continued)

OTHER PUBLICATIONS

Armitage_JP2009-140976_machine_translation_2009.pdf (Year: 2009).*

*Primary Examiner* — Tracie Y Green
(74) *Attorney, Agent, or Firm* — Harness, Dickey & Pierce, P.L.C.

(57) ABSTRACT

A light emitting device includes a substrate, a first semiconductor layer provided to the substrate, a laminated structure disposed at an opposite side to the substrate of the first semiconductor layer, and including a plurality of columnar parts, a first electrically-conductive layer as a surface layer at laminated structure side in the first semiconductor layer, and a second electrically-conductive layer opposed to the first electrically-conductive layer via the laminated structure, wherein the columnar part includes a light emitting layer configured to emit light, a second semiconductor layer which is disposed between the light emitting layer and the first electrically-conductive layer, and a third semiconductor layer disposed between the light emitting layer and the second electrically-conductive layer, concavo-convex shapes are formed on a surface of the first electrically-conductive layer, an insulating layer is disposed on the first electrically-conductive layer, and electrode layers are disposed so as to cover an area where the insulating layer is disposed, and some of the concavo-convex shapes.

6 Claims, 8 Drawing Sheets

(51) Int. Cl.
*H01L 33/38* (2010.01)
*H01L 33/54* (2010.01)

(56) References Cited

U.S. PATENT DOCUMENTS

| | | |
|---|---|---|
| 2004/0253758 A1 | 12/2004 | Jung et al. |
| 2008/0232414 A1* | 9/2008 | Masui ................. H01S 5/18311 |
| | | 438/46 |
| 2015/0034925 A1* | 2/2015 | Shinotsuka ......... H01L 51/5218 |
| | | 257/40 |
| 2015/0280062 A1* | 10/2015 | Yoo .................... H01L 33/0025 |
| | | 257/13 |
| 2015/0325743 A1* | 11/2015 | Mi ..................... H01L 21/02573 |
| | | 257/13 |
| 2015/0346522 A1 | 12/2015 | Hilarius et al. |
| 2016/0315224 A1* | 10/2016 | Komada ........... H01L 21/02505 |
| 2020/0412099 A1* | 12/2020 | Miyata ................ H01S 5/18319 |
| 2020/0412100 A1* | 12/2020 | Miyata ................ H01S 5/04256 |
| 2021/0194209 A1* | 6/2021 | Miyata ................ H01S 5/04253 |
| 2022/0173266 A1* | 6/2022 | Miyata ............... G03B 21/2006 |

FOREIGN PATENT DOCUMENTS

| | | |
|---|---|---|
| JP | 2010-135858 A | 6/2010 |
| JP | 2015-522837 A | 8/2015 |

\* cited by examiner

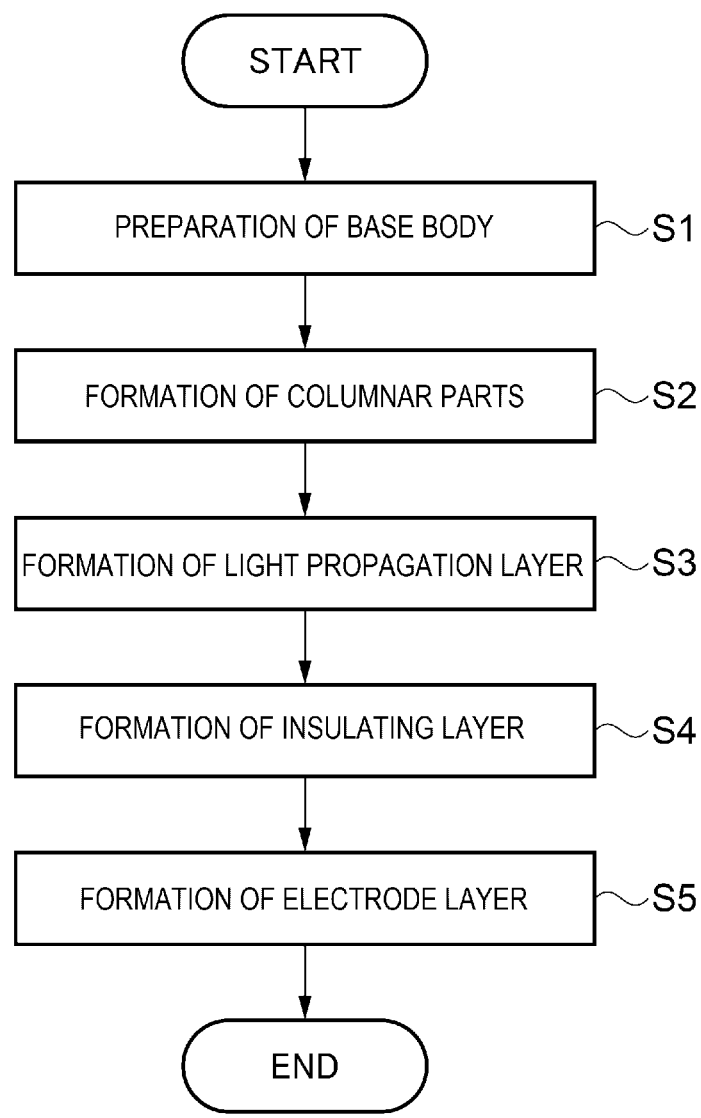

FIG. 4A
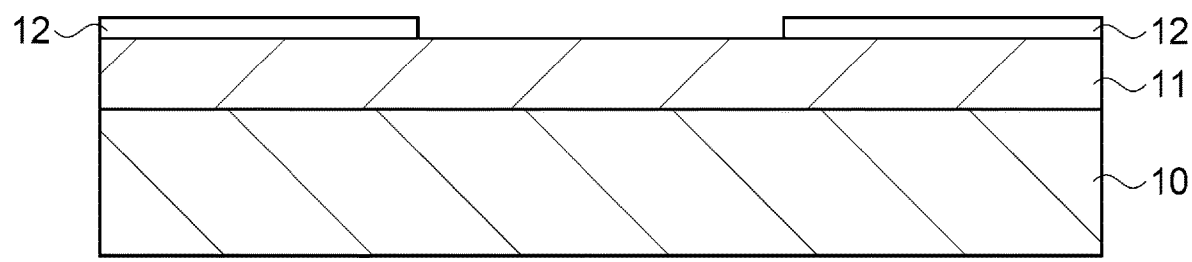
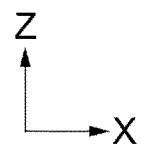
FIG. 4B
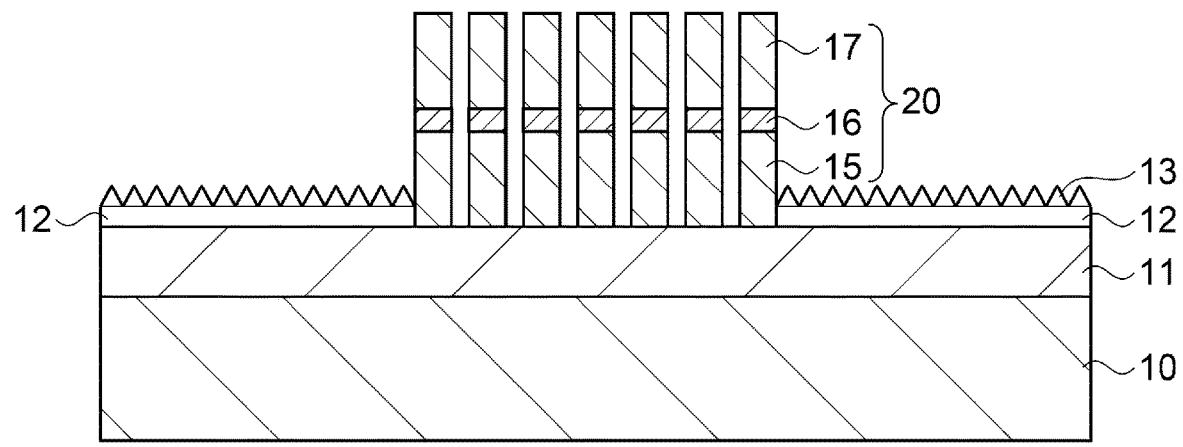
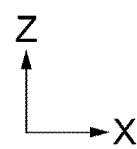

FIG. 7A
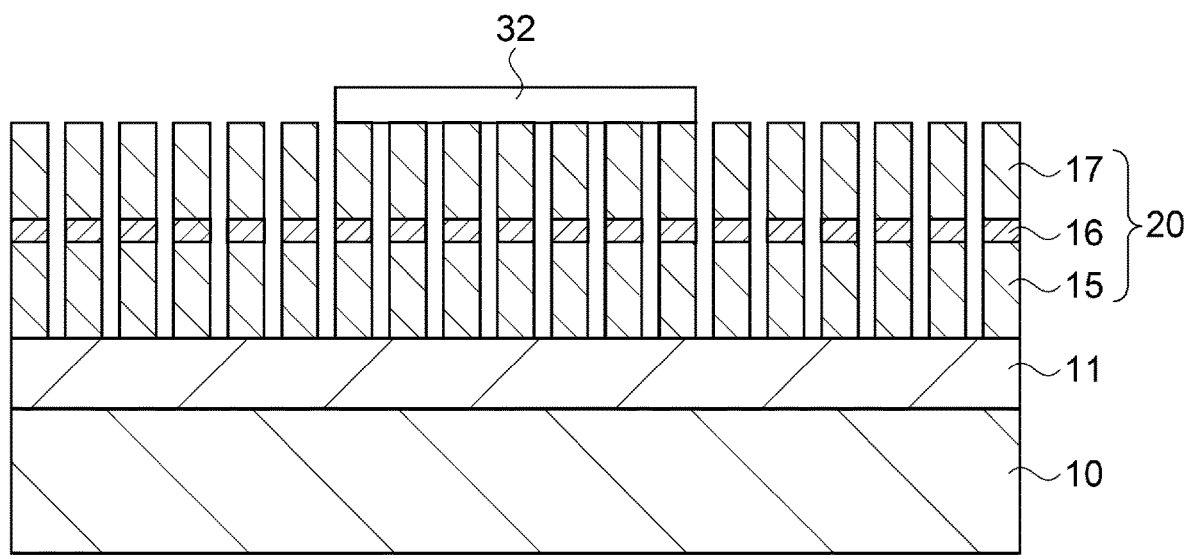
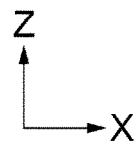
FIG. 7B
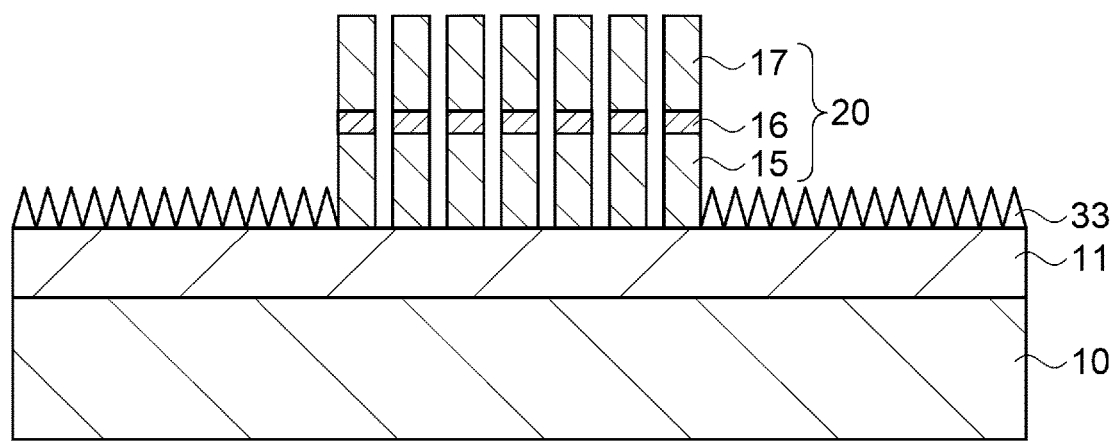
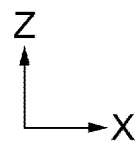

LIGHT EMITTING DEVICE HAVING COLUMNAR PARTS SURROUNDED BY CONCAVO-CONVEX SHAPES AND PROJECTOR

The present application is based on, and claims priority from JP Application Serial Number 2019-178867, filed Sep. 30, 2019, the disclosure of which is hereby incorporated by reference herein in its entirety.

BACKGROUND

1. Technical Field

The present disclosure relates to a light emitting device and a projector equipped with the light emitting device.

2. Related Art

Semiconductor lasers are promising as high-luminance next-generation light sources. In particular, the semiconductor laser having a nano-structure called a nano-column, a nano-wire, a nano-rod, a nano-pillar, or the like is expected to realize a light emitting device capable of obtaining narrow-radiation angle and high-power light emission due to an effect of a photonic crystal.

In JP-A-2010-135858 (Document 1), there is disclosed a semiconductor light emitting element having a plurality of nano-columns. According to FIG. 8 in Document 1, a part of an area where the plurality of nano-columns are formed is etched to be dug so as to reach an n-type GaN layer, and then an n-type electrode is provided to the area thus dug using an evaporation process.

However, in the technology in Document 1, there is a problem that it is difficult to ensure an electrical contacting performance as an electrode terminal in the n-type electrode. In particular, when etching the area where the plurality of nano-columns are formed, since microscopic concavo-convex shapes like a miniature of the shapes of the nano-columns remains, the concavo-convex shapes are also traced on the n-type electrode to be formed thereon. With the electrode terminal having the concavo-convex shape on the surface, it is difficult to ensure the electrical connection reliability when connecting, for example, a bonding wire. It should be noted that the dry etching is assumed as the etching.

SUMMARY

A light emitting device according to the present application includes a substrate, a first semiconductor layer provided to the substrate, a laminated structure disposed at an opposite side to the substrate of the first semiconductor layer, and including a plurality of columnar parts, a first electrically-conductive layer as a surface layer at the laminated structure side in the first semiconductor layer, and a second electrically-conductive layer opposed to the first electrically-conductive layer via the laminated structure, wherein the columnar part includes a light emitting layer configured to emit light in response to injection of an electrical current from one of the first electrically-conductive layer and the second electrically-conductive layer, a second semiconductor layer which is disposed between the light emitting layer and the first electrically-conductive layer, and is the same in conductivity type as the first semiconductor layer, and a third semiconductor layer which is disposed between the light emitting layer and the second electrically-conductive layer, and is different in conductivity type from the second semiconductor layer, concavo-convex shapes are formed on a surface of the first electrically-conductive layer, an insulating layer is disposed on the first electrically-conductive layer, and an electrode layer is disposed so as to cover an area where the insulating layer is disposed, and some of the concavo-convex shapes.

The concavo-convex shapes may irregularly be formed.

The plurality of columnar parts may regularly be arranged in a plan view, and the concavo-convex shapes may regularly be disposed.

The insulating layer may be formed using a coating-type insulating material.

The electrode layer may be formed including three layers of chromium, nickel, and gold.

A projector according to the present application is equipped with the light emitting device described above.

BRIEF DESCRIPTION OF THE DRAWINGS

FIG. 3 is a flowchart showing a method of manufacturing the light emitting device.

FIG. 4A is a process chart showing a state of a product in a manufacturing process.

FIG. 4B is a process chart showing a state of the product in the manufacturing process.

FIG. 7A is a process chart showing a state of a product in a manufacturing process.

FIG. 7B is a process chart showing a state of the product in the manufacturing process.

DESCRIPTION OF EXEMPLARY EMBODIMENTS

Embodiment 1

General Outline of Light Emitting Device

Figure 1:
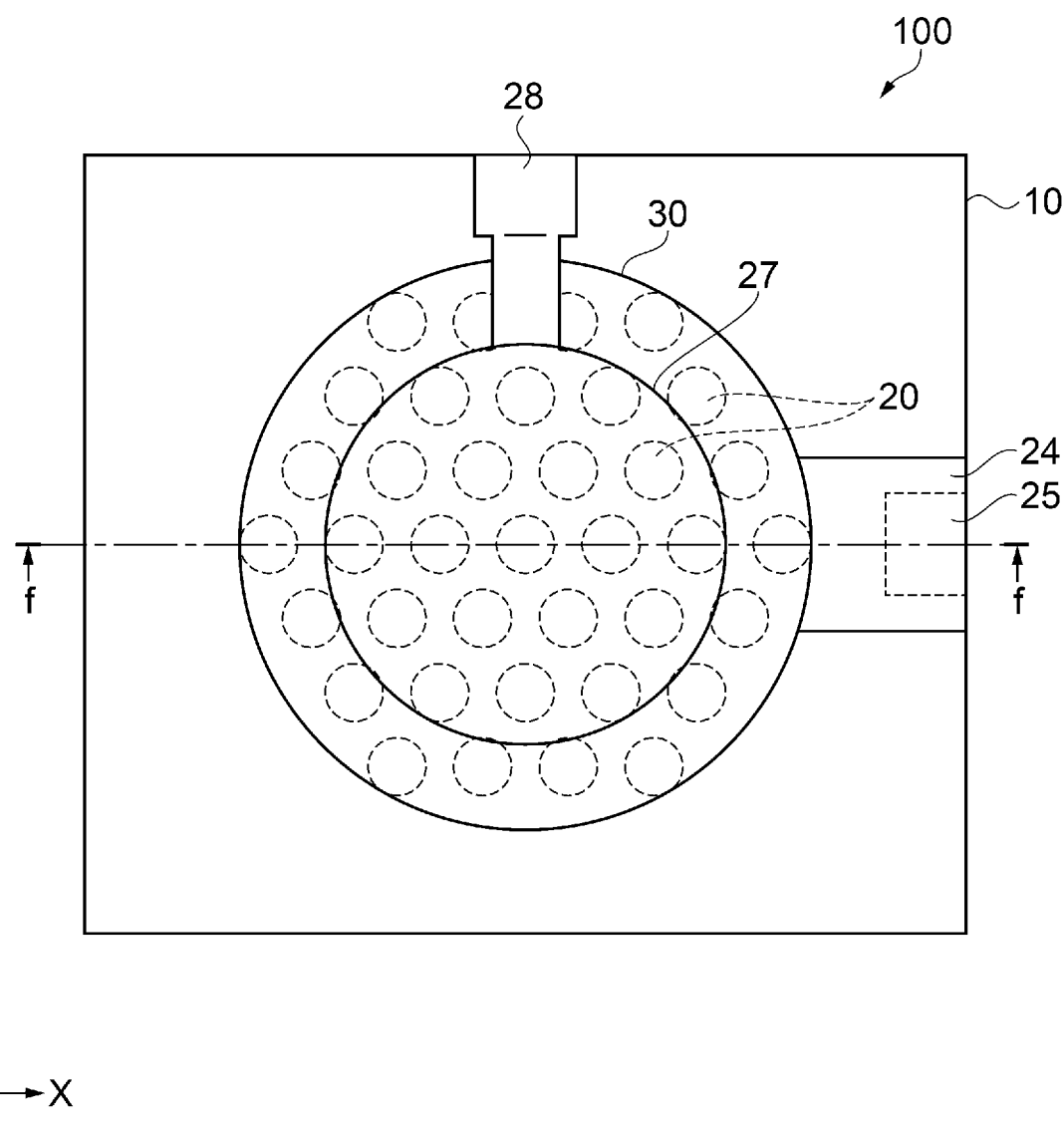
FIG. 1 is a plan view of a light emitting device according to Embodiment 1.
Figure 2:
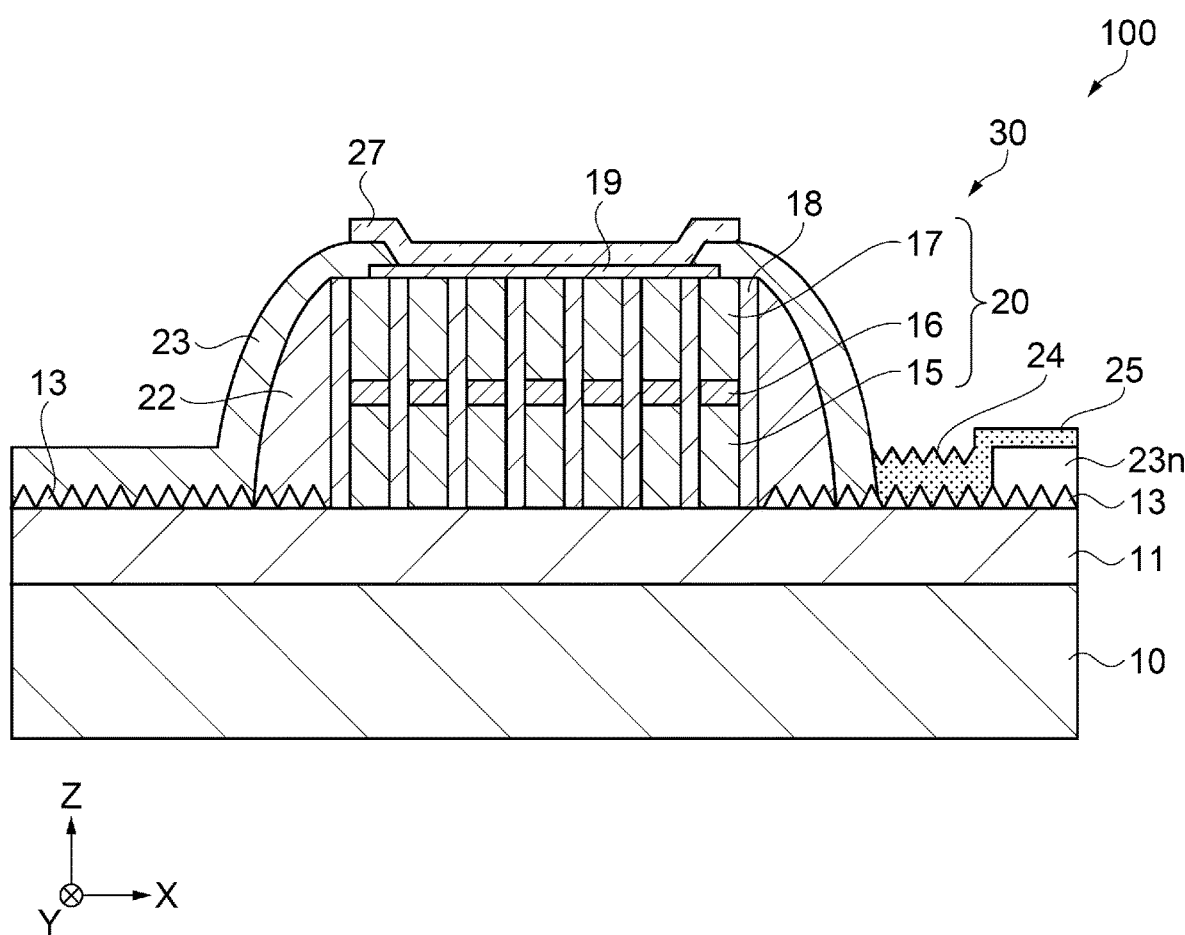
FIG. 2 is a cross-sectional view of the light emitting device.

FIG. 1 is a plan view of a light emitting device according to the present embodiment. FIG. 2 is a cross-sectional view of the light emitting device in a cross-sectional surface along the f-f line shown in FIG. 1. Firstly, a general outline of a light emitting device 100 according to the present embodiment will be described using FIG. 1 and FIG. 2. The light emitting device 100 is a semiconductor laser source provided with a plurality of nano-columns each of which is a microscopic columnar crystal structure for combining electrons and holes inside the semiconductor to thereby emit light. It should be noted that when actually using the light emitting device 100 as a light source, two or more light emitting devices 100 are regularly arranged to form an aggregate and are used as a surface light source in many cases.

Further, in FIG. 1, the description will be presented defining a direction toward a first electrode terminal 25 as a +X direction and a direction toward a second electrode terminal 28 as a +Y direction centering on a laminated structure 30. The +X direction is also referred to as a right side, and the −X direction is also referred to as a left side. In FIG. 2, a stacking direction on a substrate 10 is defined as a +Z direction. The +Z direction is also referred to as an upper side.

As shown in FIG. 2, the light emitting device 100 has a configuration provided with the laminated structure 30 including a plurality of columnar parts 20 on the substrate 10.

The substrate 10 is an Si substrate as a preferred example. It should be noted that the Si substrate is not a limitation, and it is also possible to use a GaN substrate, a sapphire substrate, a glass substrate, and so on.

On the substrate 10, there is disposed a buffer layer 11 as a first semiconductor layer. The buffer layer 11 is made as an Si-doped n-type GaN layer as a preferred example. It should be noted that a surface layer of the buffer layer 11 corresponds to a first electrically-conductive layer, and functions as an electrical interconnection.

Further, it is also possible to dispose a reflecting layer between the substrate 10 and the buffer layer 11, or on a bottom surface of the substrate 10. The reflecting layer becomes a DBR (Distributed Bragg Reflector) layer. Due to the reflecting layer, since the light proceeding toward the substrate 10 out of the light emitted from a light emitting layer 16 can be reflected, it is possible to increase the use efficiency of the light.

The columnar parts 20 are each a nano-column formed on the buffer layer 11, and are each constituted by a second semiconductor layer 15, the light emitting layer 16, and a third semiconductor layer 17. In particular, the columnar parts 20 are each a columnar body having the second semiconductor layer 15, the light emitting layer 16, and the third semiconductor layer 17 stacked in this order on the buffer layer 11. In the preferred example, the height of the columnar part 20 is set as about 1000 nm. It should be noted that the columnar part 20 is also called a nano-wire, a nano-rod, or a nano-pillar.

The second semiconductor layer 15 is an n-type semiconductor layer. In the preferred example, the second semiconductor layer 15 is made as an Si-doped n-type GaN layer.

In the preferred example, the light emitting layer 16 is made as a multiple quantum well structure obtained by stacking quantum well structures each constituted by an i-type GaN layer doped with no impurity and an i-type InGaN layer. The light emitting layer 16 emits the light in response to injection of a current from an electrode layer 19 as a second electrically-conductive layer. It should be noted that it is also possible to adopt a configuration in which the current is injected from the buffer layer 11.

The third semiconductor layer 17 is a p-type semiconductor layer. In the preferred example, the third semiconductor layer 17 is made as an Mg-doped p-type GaN layer. It should be noted that the second semiconductor layer 15 and the third semiconductor layer 17 have a function as cladding layers of confining the light in the light emitting layer 16.

As shown in FIG. 1, the columnar parts 20 each have a circular planar shape. The diameter of the columnar part 20 is in a nanometer-order range, and is, for example, no smaller than 10 nm and no larger than 500 nm. It should be noted that the circular shape is not a limitation, but an elliptical shape can be adopted, or a polygonal shape such as a hexagonal shape can be adopted. The laminated structure 30 having a circular shape is disposed at a substantially central part of the substrate 10 having a substantially square shape, and the plurality of columnar parts 20 are regularly arranged in the circular shape. An interval between the columnar parts 20 adjacent to each other is, for example, no smaller than 1 nm and no larger than 500 nm. The plurality of columnar parts 20 are arranged at a constant pitch in a predetermined direction. The arrangement configuration is only required to be a regular arrangement configuration, and can be, for example, a lattice arrangement, a triangular lattice arrangement, or a quadrangular grid arrangement.

Going back to FIG. 2, between the columnar parts 20 adjacent to each other, there is disposed a light propagation layer 18. The light propagation layer 18 is a light propagation layer formed of a material lower in refractive index than the light emitting layer 16, and propagates the light generated in the light emitting layer 16. In the preferred example, the light propagation layer 18 is made as a silicon oxide layer. It should be noted that an aluminum oxide layer and a titanium oxide layer can also be adopted. Alternatively, it is also possible to provide an air gap between the columnar parts 20 adjacent to each other. It should be noted that in the present embodiment, a structure constituted by the columnar parts 20 and the light propagation layer 18 is defined as the laminated structure 30.

On the upper surface of the laminated structure 30, there are disposed the electrode layer 19 and a second electrode 27.

The electrode layer 19 as the second electrically-conductive layer is a p-side electrode layer to electrically be coupled to the third semiconductor layer 17 of the columnar part 20. In the preferred example, the electrode layer 19 is made as a two-layer configuration constituted by an Ni layer and an Au layer. Since a thin film having the thickness of about 15 nm is adopted, it is possible to transmit the light emitted by the light emitting layer 16.

The second electrode 27 is a transparent electrode layer disposed so as to cover the electrode layer 19. The second electrode 27 is electrically coupled to the electrode layer 19 and the third semiconductor layer 17. In the preferred example, the second electrode 27 is made of ITO (indium tin oxide).

It should be noted that the two-layer configuration with the electrode layer 19 and the second electrode 27 is not a limitation, and it is also possible to form the p-side electrode as the second electrically-conductive layer of the laminated structure 30 with only either one of the layers.

On a side surface of the laminated structure 30, there are disposed a sidewall 22 and an insulating layer 23.

The sidewall 22 is a side wall having an insulating property and surrounding the side surface of the laminated structure 30. In the preferred example, the sidewall 22 is formed of silicon oxide. It should be noted that it is also possible to use silicon nitride.

The insulating layer 23 is formed so as to cover the laminated structure 30 including the sidewall 22, and a part of the buffer layer 11. In the preferred example, the insulating layer 23 is formed using a coating-type insulating material. As the coating-type insulating material, it is possible to use silicon oxide or polyimide.

Going back to FIG. 1, in a plan view, the insulating layer 23 is formed as a protective layer in a portion excluding a first electrode 24 and the second electrode 27. Further, the second electrode terminal 28 is formed on the insulating layer 23.

The first electrode 24 is a metal electrode formed on the buffer layer 11, and is electrically coupled to the second semiconductor layers 15 of the columnar parts 20. The first electrode 24 is made as a three-layer configuration constituted by a Cr layer, an Ni layer, and an Au layer. The thickness is about 400 nm. In other words, the electrode layer is formed including the three layers of chromium, nickel, and gold. By adopting the three-layer structure, the electrical and mechanical connectivity is enhanced. The first electrode terminal 25 is a coupling terminal formed of the first electrode 24 extending, and a foundation layer of the first electrode terminal 25 is an insulating layer 23n (FIG. 2) which is planarized. The first electrode terminal 25 forms a rectangular shape, and is disposed in a substantially central part in a right side of the substrate 10. Three sides except the side along the right side of the substrate 10 in the first electrode terminal 25 extend outward to form the first electrode 24.

The second electrode 27 is set to the state of being exposed on the upper surface of the laminated structure 30 in a plan view, and forms an exit port for the light emitted by the light emitting layer 16. The second electrode terminal 28 is a coupling terminal of the p-side electrode, and is electrically coupled to the second electrode 27. The second electrode terminal 28 forms a rectangular shape, and is disposed in a substantially central part in a side on the +Y side of the substrate 10. The second electrode terminal 28 is formed on the insulating layer 23 (FIG. 2), and is formed of the same metal layer as that of the first electrode 24. Since the insulating layer 23 intervenes, the insulating property with the buffer layer 11 (FIG. 2) is ensured.

Going back to FIG. 2, in the light emitting device 100, a pin diode is constituted by the p-type third semiconductor layer 17, the light emitting layer 16, and the n-type second semiconductor layer 15. When applying a forward bias voltage of the pin diode between the first electrode 24 and the second electrode 27, the electrical current is injected into the light emitting layer 16, and recombination of electrons and holes occurs in the light emitting layer 16. The recombination causes light emission.

The light generated in the light emitting layer 16 propagates in a direction perpendicular to the stacking direction due to the second semiconductor layer 15 and the third semiconductor layer 17 through the light propagation layer 18 to form a standing wave due to the effect of the photonic crystal caused by the plurality of columnar parts 20, and then causes laser oscillation with a gain in the light emitting layer 16. Then, the light emitting device 100 emits positive first-order diffracted light and negative first-order diffracted light as a laser beam in the stacking direction via the second electrode 27.

Details of First Electrode and First Electrode Terminal

Microscopic concavo-convex shapes 13 occur on the surface of the buffer layer 11. In other words, on the surface of the first electrically-conductive layer as the surface layer of the buffer layer 11, there exist the concavo-convex shapes 13. It should be noted that the reason that the concavo-convex shapes 13 occur will be described later. The concavo-convex shapes 13 are each a region occurring when etching the buffer layer 11, and are therefore a part of the buffer layer 11, and become the same region.

Since the first electrode 24 is disposed so as to copy the concavo-convex shapes 13 of the buffer layer 11, the concavo-convex shapes are also traced on the surface of the first electrode 24. Supposedly, when using the first electrode 24 provided with the concavo-convex shapes as the coupling terminal, there is a problem that it is difficult to achieve a stable electrical junction due to the concavo-convex shapes when connecting the bonding wire. It should be noted that the same applies to when achieving the junction using an anisotropic conductive film.

In the present embodiment, in the junction between the first electrode 24 and the buffer layer 11, since the junction area increases due to the concavo-convex shapes 13, it becomes difficult for the first electrode 24 to be separated in addition to the reduction of the junction resistance. In other words, the contacting reliability increases compared to when being formed on a flat surface.

Further, the foundation layer of the first electrode terminal 25 as the coupling terminal formed of the first electrode 24 extending is the insulating layer 23n which is planarized. The insulating layer 23n is formed using the coating-type insulating material in the same process as that of the insulating layer 23 covering the laminated structure 30. By using the coating-type insulating material excellent in coverage, the insulating layer 23n absorbs the concavo-convex shapes 13, and has a substantially planarized surface. It should be noted that the first electrode terminal 25 and the first electrode 24 correspond to an electrode layer.

Method of Manufacturing Light Emitting Device

FIG. 3 is a flowchart showing a method of manufacturing the light emitting device. FIG. 4A through FIG. 4D are each a process chart showing a state of a product in a manufacturing process. Here, a method of manufacturing the light emitting device will be described with reference mainly to FIG. 3 arbitrarily sprinkled with FIG. 4A through FIG. 4D.

The light emitting device 100 can basically be manufactured by a method used in the known semiconductor process such as a CVD (Chemical Vapor Deposition) method, a photolithography method (patterning), a sputtering method, an etching method, or a CMP (Chemical Mechanical Planarization) method, or a mixture of some of these methods. Although a preferred manufacturing method will hereinafter mainly be described, another manufacturing method can also be used providing an equivalent structure can be formed, and at the same time, the functions and the characteristics in the structure can be fulfilled.

In the step S1, the substrate 10 is prepared prior to the formation of the nano-columns. In particular, as shown in FIG. 4A, the buffer layer 11 is grown epitaxially on the substrate 10. As the method of the epitaxial growth, there is used, for example, an MOCVD (Metal Organic Chemical Vapor Deposition) method, or an MBE (Molecular Beam Epitaxy) method.

Subsequently, on the buffer layer 11, there is formed a selective mask 12 as a hard mask for zoning formation areas of the columnar parts 20. As the selective mask 12, there is used Ti in the preferred example. As shown in FIG. 4A, the selective mask 12 is provided with opening parts in the formation areas of the columnar parts 20. The selective mask 12 is formed by, for example, performing deposition with the sputtering method, and then performing patterning.

In the step S2, the columnar parts 20 are formed. In particular, the second semiconductor layer 15, the light emitting layer 16, and the third semiconductor layer 17 are grown epitaxially in this order on the buffer layer 11 in the opening parts of the selective mask 12. As the method of the epitaxial growth, there is used the MOCVD method, the MBE method, or the like. Thus, as shown in FIG. 4B, the plurality of columnar parts 20 can be formed.

On the other hand, according to an experimental result by the inventors and so on, it is confirmed that a microscopic semiconductor material collaterally grows also on the selective mask 12 when forming the columnar parts 20. This microscopic growing region is referred to as the concavo-convex shape 13. Further, the concavo-convex shape 13 occurring in other areas than the opening areas of the selective mask 12 is also referred to as outside growth.

Figure 4C:
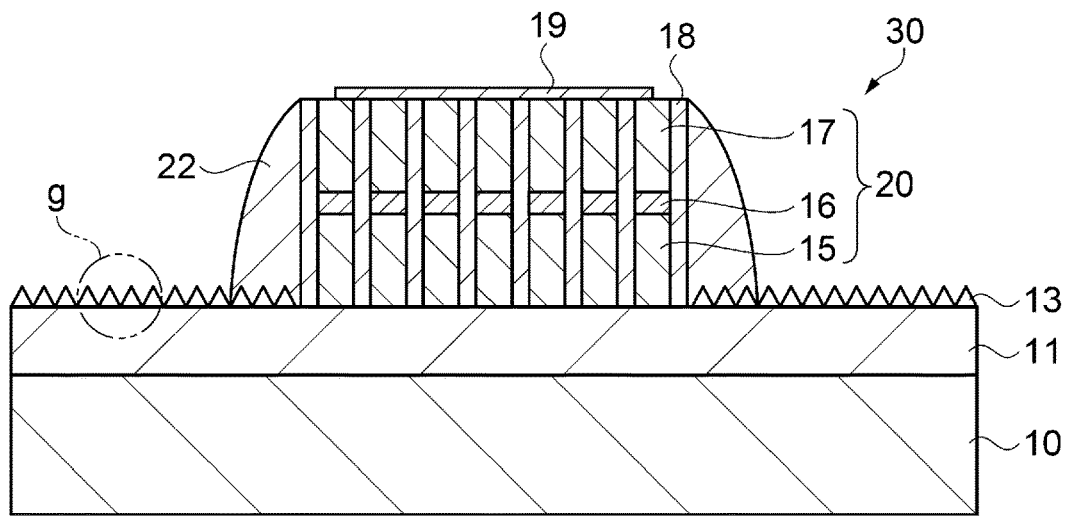
FIG. 4C is a process chart showing a state of the product in the manufacturing process.

In the step S3, the light propagation layer, the sidewall 22, and so on are formed. Firstly, as shown in FIG. 4C, the light propagation layer 18 is formed between the columnar parts 20 adjacent to each other. The light propagation layer 18 is formed by performing the deposition using the MOCVD method, a spin coat method, or the like, and then performing patterning including dry etching, and so on. Due to the processes up to the present process, the laminated structure 30 is formed.

Then, the sidewall 22 is formed on the side wall of the laminated structure 30. In particular, the sidewall 22 is formed by depositing a silicon oxide layer on the entire surface, and then performing patterning including dry etching.

Then, the electrode layer 19 is formed on the upper surface of the laminated structure 30. The electrode layer 19 is formed by performing the deposition with the CVD method or the sputtering method, and then performing patterning including the dry etching.

Figure 5:
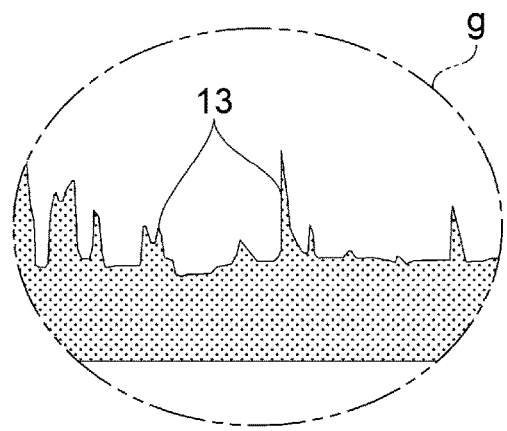
FIG. 5 is an enlarged view of a part g in FIG. 4C.

FIG. 5 is an enlarged view of a part g in the concavo-convex shapes shown in FIG. 4C.

Here, in the patterning performed in the step S3 described above, the dry etching is performed a plurality of times so as to remove the selective mask 12 to expose the buffer layer 11, but the concavo-convex shapes 13 remain. In particular, since the dry etching is the anisotropic etching, the etching is performed in the Z direction substantially perpendicular to the substrate 10. Therefore, although the concavo-convex shapes are reduced, there remain the concavo-convex shapes 13 formed by tracing the concavo-convex shapes in a miniaturized manner.

Therefore, as shown in FIG. 5, there is created the state in which the plurality of irregular concavo-convex shapes 13 remain on the buffer layer 11. The height of the convex shape is in a range of about 30 nm through 200 nm. Since the concavo-convex shapes 13 are formed irregularly, a complicated junction is formed when forming the first electrode 24, and therefore, the contact area increases.

In the step S4, the insulating layer 23 and the insulating layer 23n are formed. In particular, the insulating layers 23, 23n are formed by depositing coating-type silicon dioxide using the spin coat method, and then performing patterning including the dry etching. It should be noted that it is sufficient for the material to be a coating-type insulating material, and it is possible to use, for example, polyimide.

Figure 4D:
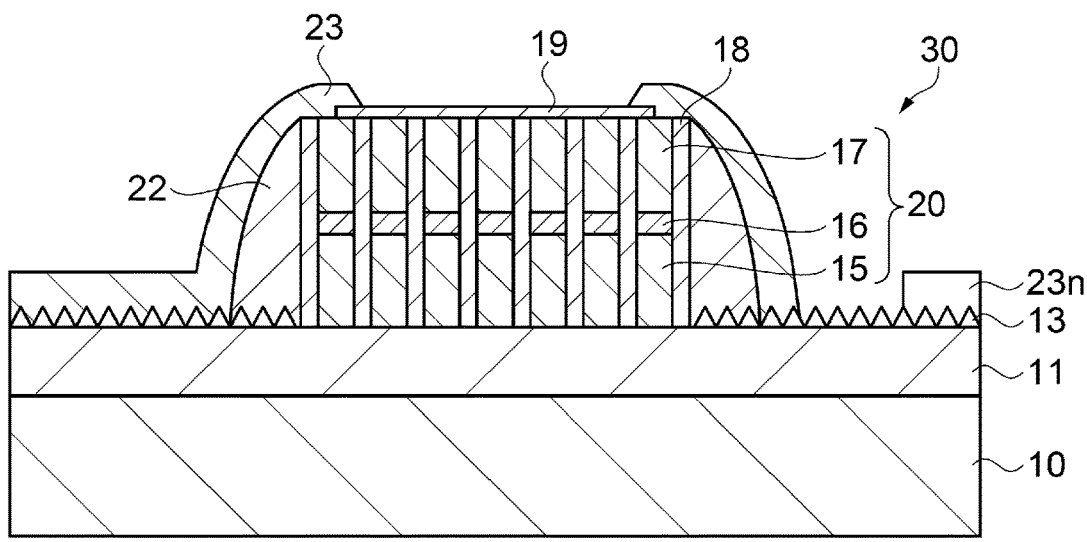
FIG. 4D is a process chart showing a state of the product in the manufacturing process.

Thus, as shown in FIG. 4D, the insulating layer 23 is formed so as to cover the side surface of the laminated structure 30 including the sidewall 22, and a part of the buffer layer 11. Further, the insulating layer 23n is formed like an island along an end part of the substrate 10 on the buffer layer 11. The insulating layer 23n is formed so as to cover the concavo-convex shapes 13, and the upper surface thereof is planarized.

In the step S5, the first electrode 24, the first electrode terminal 25, and the second electrode 27 are formed. In particular, the first electrode 24 and the first electrode terminal 25 are formed by performing the deposition with the CVD method or the sputtering method, and then performing patterning including the dry etching.

Thus, as shown in FIG. 2, the first electrode 24 is formed so as to cover the concavo-convex shapes 13 of the buffer layer 11. Then, the first electrode terminal 25 formed of the first electrode 24 extending is formed on the insulating layer 23n thus planarized.

Further, the second electrode 27 is formed on the upper surface of the laminated structure 30 by performing the deposition with the sputtering method, and then performing patterning including the dry etching. Finally, the second electrode terminal 28 (FIG. 1) as a coupling interconnection from the second electrode 27 is formed with a known method.

According to the present embodiment, the following advantages can be obtained.

On the concavo-convex shapes 13 of the buffer layer 11, there is selectively disposed the insulating layer 23n, the electrode layer is disposed so as to cover the area where the insulating layer 23n is disposed and some of the concavo-convex shapes 13, and the electrode layer forms the first electrode 24 and the first electrode terminal 25.

Since the first electrode 24 is formed and then joined so as to copy the concavo-convex shapes 13 of the buffer layer 11, the junction area increases to decrease the junction resistance compared to when the first electrode 24 is formed on a flat surface. Further, since the complicated junction is formed compared to when being joined to the flat surface, the first electrode 24 becomes difficult to separate. In other words, the contacting reliability increases in terms of electrical contact and strength compared to when being formed on the flat surface.

Further, since the first electrode terminal 25 formed contiguously to the first electrode 24 is formed on the insulating layer 23n thus planarized, the surface of the first electrode terminal 25 is also made flat. Thus, it is possible to reliably achieve the electrical coupling to an external coupling terminal such as a bonding wire. In other words, it is possible to reliably achieve the electrical and mechanical coupling with the first electrode 24, and at the same time, reliably achieve the coupling to the external coupling terminal with the first electrode terminal 25.

Therefore, it is possible to provide the light emitting device 100 equipped with the first electrode 24 and the first electrode terminal 25 ensuring the electrical connection reliability.

Embodiment 2

General Outline of Light Emitting Device

Figure 6:
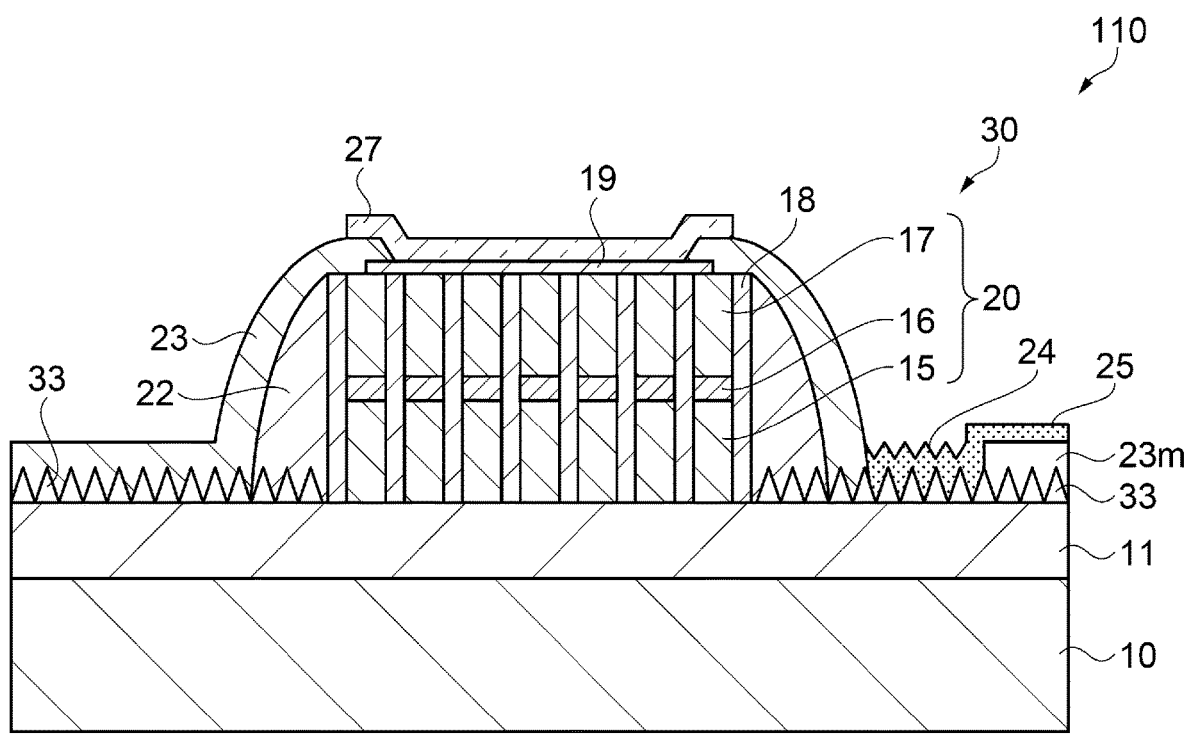
FIG. 6 is a cross-sectional view of a light emitting device according to Embodiment 2.

FIG. 6 is a cross-sectional view of a light emitting device according to the present embodiment, and corresponds to FIG. 2.

The configuration of a light emitting device 110 according to the present embodiment is basically the same as that of the light emitting device 100 according to Embodiment 1, but is different in the point that the size of concavo-convex shapes 33 in the buffer layer 11 is made larger than the size of the concavo-convex shapes 13 in Embodiment 1. The configuration other than the size of the concavo-convex shapes is the same as that of the light emitting device 100 according to Embodiment 1 including the planar shape. Further, the reason that the size of the concavo-convex shapes is different is that the manufacturing method is partially different.

The light emitting device 110 according to the present embodiment will hereinafter be described with a focus on the difference from the light emitting device 100 according to Embodiment 1. The same regions are denoted by the same reference symbols, and the duplicated descriptions will be omitted.

FIG. 7A and FIG. 7B are each a process chart showing a state of a product in a manufacturing process, and correspond respectively to FIG. 4A and FIG. 4B. Here, a method of manufacturing the light emitting device 110 will be described with reference mainly to FIG. 3 arbitrarily sprinkled with FIG. 7A and FIG. 7B.

Firstly, in the light emitting device 110, the selective mask 12 (FIG. 4A) is not formed in the step S1. As shown in FIG. 7A, in the step S2, the columnar parts 20 are formed throughout the entire surface of the substrate 10.

Subsequently, in the plurality of columnar parts 20 thus formed, a part to be left is selectively provided with a resist mask 32. Then, as shown in FIG. 7B, patterning including the dry etching is performed to thereby form the plurality of columnar parts 20 in the part to be the laminated structure 30. The processes up to this process are the process performed in the step S2.

On this occasion, the columnar parts 20 in the part exposed from the resist mask 32 become smaller due to the dry etching, but the concavo-convex shapes 33 formed by tracing the columnar parts 20 in a miniaturized manner remain due to the anisotropy of the dry etching described above. Here, since the size of the columnar part 20 is larger than the initial concavo-convex shapes 13 (FIG. 4B) collaterally generated in Embodiment 1, the concavo-convex shapes 33 on which the dry etching has been performed are also larger than the concavo-convex shapes 13 in Embodiment 1.

Going back to FIG. 6, thus the concavo-convex shapes 33 larger in asperity than the concavo-convex shapes 13 are formed, and therefore in the junction between the first electrode 24 and the buffer layer 11, the junction area further increases. Therefore, in addition to the further reduction of the junction resistance, the first electrode 24 becomes more difficult to separate. In other words, the contacting reliability between the first electrode 24 and the buffer layer 11 further increases.

It should be noted that since the concavo-convex shapes 33 are formed by miniaturizing the columnar parts 20 regularly arranged in a plan view, the planar arrangement of the concavo-convex shapes 33 becomes a regular arrangement. Since the concavo-convex shapes 33 are formed regularly, when forming the first electrode 24, it is possible to achieve the junction which is homogenous and stable throughout the entire surface.

According to the present embodiment, the following advantages can be obtained in addition to the advantages in Embodiment 1.

The concavo-convex shapes 33 provided to the buffer layer 11 in the present embodiment is larger in asperity than the concavo-convex shapes 13 in Embodiment 1. Therefore, since the junction area between the buffer layer 11 and the first electrode 24 further increases, the junction resistance further decreases. Further, the first electrode 24 becomes more difficult to separate, and thus, the mechanical connectivity also increases.

Therefore, it is possible to provide the light emitting device 110 equipped with the first electrode 24 and the first electrode terminal 25 ensuring the electrical connection reliability.

Embodiment 3

General Outline of Projector

Figure 8:
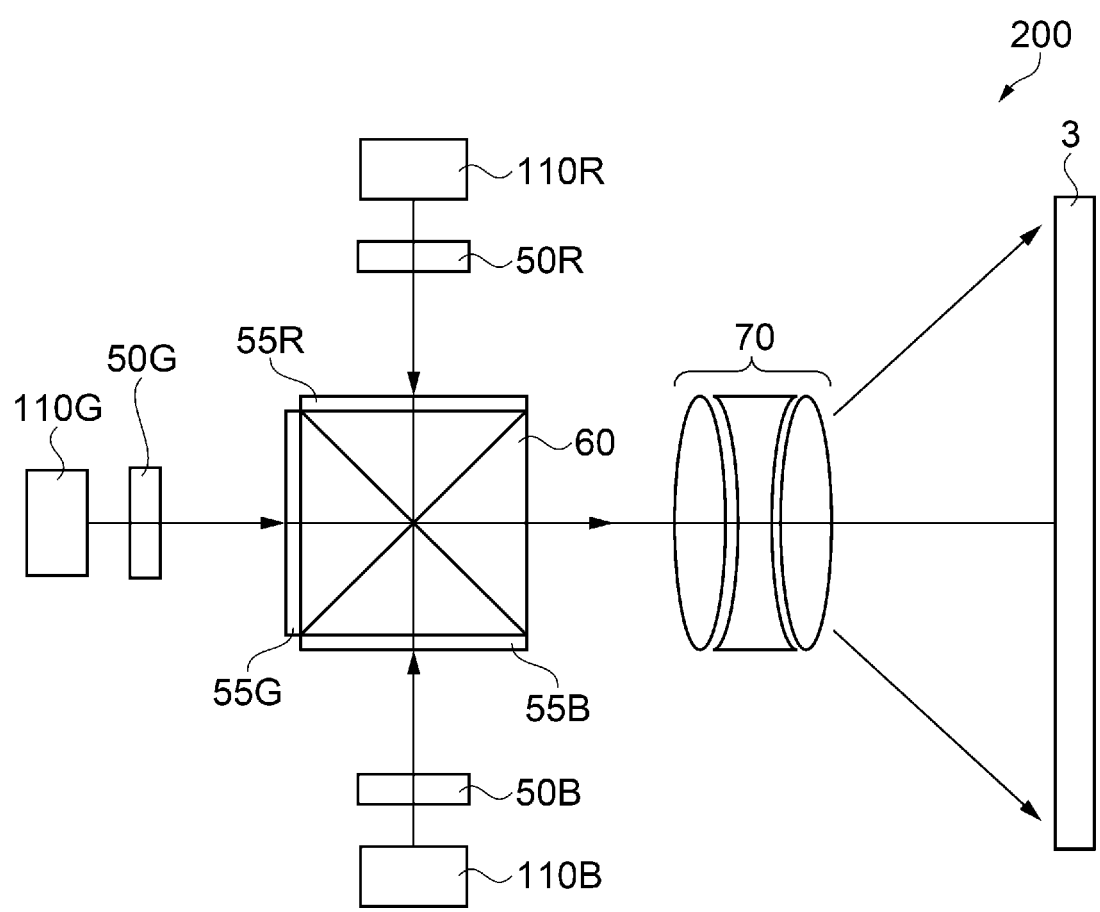
FIG. 8 is a schematic configuration diagram of a projector according to Embodiment 3.

FIG. 8 is a schematic configuration diagram of a projector according to the present embodiment.

Here, a projector 200 according to the present embodiment will be described using FIG. 8.

The projector 200 is provided with a housing not shown, a red light source 110R, a green light source 110G, and a blue light source 110B which are disposed inside the housing, and respectively emit red light, green light, and blue light.

The red light source 110R, the green light source 110G, and the blue light source 110B are each provided with the light emitting device 100 according to Embodiment 1 or the light emitting device 110 according to Embodiment 2 as the light source.

The projector 200 further includes a first optical element 50R, a second optical element 50G, a third optical element 50B, a first light modulation device 55R, a second light modulation device 55G, a third light modulation device 55B, and a projection device 70 all installed inside the housing.

The first light modulation device 55R, the second light modulation device 55G, and the third light modulation device 55B are each, for example, a transmissive liquid crystal light valve. The projection device 70 is, for example, a projection lens.

The light emitted from the red light source 110R enters the first optical element 50R. The light emitted from the red light source 110R is collected by the first optical element 50R. It should be noted that the first optical element 50R can be provided with other functions than the light collection. The same applies to the second optical element 50G and the third optical element 50B described later.

The light collected by the first optical element 50R enters the first light modulation device 55R. The first light modulation device 55R modulates the incident light in accordance with image information. Then, the projection device 70 projects an image formed by the first light modulation device 55R on a screen 3 in an enlarged manner.

The light emitted from the green light source 110G enters the second optical element 50G. The light emitted from the green light source 110G is collected by the second optical element 50G.

The light collected by the second optical element 50G enters the second light modulation device 55G. The second light modulation device 55G modulates the incident light in accordance with the image information. Then, the projection device 70 projects an image formed by the second light modulation device 55G on the screen 3 in an enlarged manner.

The light emitted from the blue light source 110B enters the third optical element 50B. The light emitted from the blue light source 110B is collected by the third optical element 50B. The light collected by the third optical element 50B enters the third light modulation device 55B. The third light modulation device 55B modulates the incident light in accordance with the image information. Then, the projection device 70 projects an image formed by the third light modulation device 55B on the screen 3 in an enlarged manner.

Further, the projector 200 is provided with a cross dichroic prism 60 for combining the light emitted from the first light modulation device 55R, the light emitted from the second light modulation device 55G, and the light emitted from the third light modulation device 55B with each other to guide the light thus combined to the projection device 70.

The three colors of light respectively modulated by the first light modulation device 55R, the second light modulation device 55G, and the third light modulation device 55B enter the cross dichroic prism 60. The cross dichroic prism 60 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 3 by the projection device 70, and thus, an enlarged image is displayed.

It should be noted that it is possible for the red light source 110R, the green light source 110G, and the blue light source 110B to directly form the images by controlling the light emitting devices 100 as the pixels of the image in accordance with the image information without using the first light modulation device 55R, the second light modulation device 55G, and the third light modulation device 55B. Further, it is also possible for the projection device 70 to project the images formed by the red light source 110R, the green light source 110G, and the blue light source 110B on the screen 3 in an enlarged manner.

As described hereinabove, the projector 200 is provided with the light emitting devices 110 having the electrode terminal excellent in electrical connection reliability. Therefore, it is possible to project the bright image due to the stable light emission.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting devices according to the embodiments described above can also be used for other devices than projectors. As the applications other than projectors, there can be cited, for example, a light source of indoor and outdoor illumination, a display, a laser printer, a scanner, an in-car light, sensing equipment using light, communication equipment, and so on.

Modified Example 1

Although in Embodiment 1 described above, there is described when the light emitting device 100 is the semiconductor laser using the columnar parts 20, the light emitting device 100 can be a super luminescent diode using the columnar parts 20, or can also be a light emitting diode using the columnar parts 20. The same applies to the light emitting devices according to Embodiment 2 and Embodiment 3.

Modified Example 2

Modified Example 2 will be described using FIG. 2 and FIG. 3.

In the embodiments described above, there is presented the description assuming that the height of the buffer layer 11 is substantially the same between the part where the laminated structure 20 is formed and the part where the electrode layer is formed, but the part where the electrode layer is formed can be made one step lower. In this case, it is sufficient to dig down the buffer layer 11 in the part where the electrode layer is formed to thereby make the part one step lower than the part where the laminated structure 20 is formed with the dry etching performed a plurality of times in the step S3 shown in FIG. 3. The rest of the configuration is substantially the same as in the embodiments described above.

According also to this configuration, since the concavo-convex shapes remain on the surface of the buffer layer 11 one step lower, it is possible to obtain substantially the same functions and advantages as in the embodiments described above.

Modified Example 3

Although there is described the light emitting layer 16 of the InGaN type in the light emitting device 100 according to Embodiment 1 described above, as the light emitting layer 16, there can be used a variety of types of material capable of emitting light in response to injection of an electrical current in accordance with the wavelength of the light to be emitted. It is possible to use semiconductor materials of, for example, an AlGaN type, an AlGaAs type, an InGaAs type, an InGaAsP type, an InP type, a GaP type, or an AlGaP type. The same applies to the light emitting devices according to Embodiment 2 and Embodiment 3.

The contents derived from the embodiments will hereinafter be described.

The light emitting device according to the present application includes a substrate, a first semiconductor layer provided to the substrate, a laminated structure disposed at an opposite side to the substrate of the first semiconductor layer, and including a plurality of columnar parts, a first electrically-conductive layer as a surface layer at the laminated structure side in the first semiconductor layer, and a second electrically-conductive layer opposed to the first electrically-conductive layer via the laminated structure, wherein the columnar part includes a light emitting layer configured to emit light in response to injection of an electrical current from one of the first electrically-conductive layer and the second electrically-conductive layer, a second semiconductor layer which is disposed between the light emitting layer and the first electrically-conductive layer, and is the same in conductivity type as the first semiconductor layer, and a third semiconductor layer which is disposed between the light emitting layer and the second electrically-conductive layer, and is different in conductivity type from the second semiconductor layer, concavo-convex shapes are formed on a surface of the first electrically-conductive layer, an insulating layer is disposed on the first electrically-conductive layer, and an electrode layer is disposed so as to cover an area where the insulating layer is disposed, and some of the concavo-convex shapes.

According to this configuration, since the electrode layer is formed and then joined so as to copy the concavo-convex shapes in the electrode layer part formed so as to cover some of the concavo-convex shapes, the junction area with the first electrically-conductive layer increases, and the junction resistance also decreases compared to when being formed on a flat surface. Further, since the complicated junction is formed compared to when being joined to the flat surface, the electrode layer becomes difficult to separate from the first electrically-conductive layer. In other words, the contacting reliability increases in terms of electrical contact and mechanical contact compared to when being formed on the flat surface. Further, since the electrode layer part formed in an area where the insulating layer is disposed is formed on the insulating layer thus planarized, the surface of the electrode layer is also made flat. Thus, it is possible to reliably achieve the electrical coupling to an external coupling terminal such as a bonding wire.

Therefore, it is possible to provide the light emitting device equipped with the electrode layer ensuring the electrical connection reliability.

Further, the concavo-convex shapes may irregularly be formed.

According to this configuration, due to the irregular configuration, when forming the electrode layer, the complicated junction is formed to increase the junction area, and thus, it is possible to increase the electrical connection reliability.

Further, the plurality of columnar parts may regularly be arranged in a plan view, and the concavo-convex shapes may regularly be disposed.

According to this configuration, due to the regular formation, when forming the electrode layer, the junction can be made homogenous and stable throughout the entire surface, it is possible to increase the electrical and mechanical connection reliability.

Further, the insulating layer may be formed using a coating-type insulating material.

According to this configuration, it is possible to absorb the concavo-convex shapes to simply and easily form the insulating layer with the surface planarized.

Further, the electrode layer may be formed including three layers of chromium, nickel, and gold.

According to this configuration, it is possible to enhance the electrical and mechanical connection reliability.

The projector according to the present application is equipped with the light emitting device described above.

According to this configuration, it is possible to project the bright image due to the stable light emission.

What is claimed is:

1. A light emitting device comprising:
    a substrate;
    a first semiconductor layer provided to the substrate, the first semiconductor layer being divided into a center area and a peripheral area surrounding the center area;
    a laminated structure disposed on the first semiconductor layer, the laminated structure including a plurality of columnar parts, the plurality of columnar parts being disposed at the center area of the first semiconductor layer;
    a first electrically-conductive layer disposed on the peripheral area of the first semiconductor layer; and
    a second electrically-conductive layer disposed on a top of the plurality of columnar parts, wherein
    each of the plurality of columnar parts includes:
        a light emitting layer configured to emit light in response to injection of an electrical current from one of the first electrically-conductive layer and the second electrically-conductive layer;
        a second semiconductor layer which is disposed between the light emitting layer and the first electrically-conductive layer, and is same in conductivity type as the first semiconductor layer; and
        a third semiconductor layer which is disposed between the light emitting layer and the second electrically-conductive layer, and is different in conductivity type from the second semiconductor layer,
    concavo-convex shapes are formed on a surface of the first electrically-conductive layer in the peripheral area of the first semiconductor layer,
    an insulating layer is disposed on the first electrically-conductive layer having the concavo-convex shapes in the peripheral area of the first semiconductor layer, and
    an electrode layer is disposed so as to cover an area where the insulating layer is disposed, and some of the concavo-convex shapes.

2. The light emitting device according to claim 1, wherein the concavo-convex shapes are irregularly formed.

3. The light emitting device according to claim 1, wherein the plurality of columnar parts are regularly arranged in a plan view, and
the concavo-convex shapes are regularly disposed.

4. The light emitting device according to claim 1, wherein the insulating layer is formed using a coating-type insulating material.

5. The light emitting device according to claim 1, wherein the electrode layer is formed including three layers of chromium, nickel, and gold.

6. A projector comprising:
the light emitting device according to claim 1.

* * * * *